(12) United States Patent
Peschke et al.

(10) Patent No.: US 8,278,953 B2
(45) Date of Patent: Oct. 2, 2012

(54) OSCILLOSCOPE PROBE

(75) Inventors: Martin Peschke, Munich (DE); Alexander Schild, Feldkirchen (DE); Gerhard Kahmen, Deisenhofen (DE)

(73) Assignee: Rohde & Schwarz GmbH & Co. KG, München (DE)

( * ) Notice: Subject to any disclaimer, the term of this patent is extended or adjusted under 35 U.S.C. 154(b) by 154 days.

(21) Appl. No.: 12/298,789

(22) PCT Filed: Jul. 5, 2007

(86) PCT No.: PCT/EP2007/005981
§ 371 (c)(1), (2), (4) Date: Oct. 28, 2008

(87) PCT Pub. No.: WO2008/019732
PCT Pub. Date: Feb. 21, 2008

(65) Prior Publication Data
US 2010/0231199 A1   Sep. 16, 2010

(30) Foreign Application Priority Data

Aug. 14, 2006  (DE) .......................... 10 2006 038 027
Nov. 8, 2006  (DE) .......................... 10 2006 052 748

(51) Int. Cl.
*G01R 31/20*   (2006.01)
(52) U.S. Cl. ............... 324/754.07; 324/121 R; 324/72.5
(58) Field of Classification Search ............... 324/121 R, 324/72.5, 754.01–754.07
See application file for complete search history.

(56) References Cited

U.S. PATENT DOCUMENTS

| | | | | |
|---|---|---|---|---|
| 3,863,149 A * | 1/1975 | Johnson | .......................... | 324/72.5 |
| 4,646,005 A * | 2/1987 | Ryan | ......................... | 324/123 R |
| 4,739,259 A * | 4/1988 | Hadwin et al. | ................. | 324/761 |
| 4,745,365 A * | 5/1988 | Ugenti | .............................. | 327/37 |
| 5,061,892 A | 10/1991 | O'Hara et al. | | |
| 5,172,051 A | 12/1992 | Zamborelli | | |
| 5,200,717 A | 4/1993 | Kyle | | |
| 5,225,776 A * | 7/1993 | Dobos et al. | ............... | 324/121 R |
| 5,600,176 A * | 2/1997 | Bucksch | ........................ | 257/536 |
| 5,602,483 A | 2/1997 | Uhling et al. | | |
| 5,654,669 A | 8/1997 | Uhling et al. | | |
| 5,796,308 A | 8/1998 | Link et al. | | |
| 6,483,284 B1 * | 11/2002 | Eskeldson et al. | ........... | 324/72.5 |
| 6,720,828 B2 | 4/2004 | Nelson et al. | | |
| 6,828,769 B2 | 12/2004 | Campbell et al. | | |
| 6,870,359 B1 | 3/2005 | Sekel | | |
| 6,949,919 B1 | 9/2005 | Cannon | | |

(Continued)

FOREIGN PATENT DOCUMENTS

EP   0 721 109   7/1996

(Continued)

OTHER PUBLICATIONS

International Search Report for PCT/EP2007/005981 dated Jan. 9, 2008.

*Primary Examiner* — Arleen M Vazquez
(74) *Attorney, Agent, or Firm* — Marshall, Gerstein & Borun LLP

(57) ABSTRACT

In an oscilloscope probe with a transistor amplifier constructed on a semiconductor substrate using integrated circuit technology, at least one part of the input-voltage divider is also constructed together with the amplifier using integrated-circuit technology on the semiconductor substrate.

2 Claims, 1 Drawing Sheet

U.S. PATENT DOCUMENTS

| | | |
|---|---|---|
| 6,967,473 B1 | 11/2005 | Reed et al. |
| 6,982,550 B2 | 1/2006 | Cannon |
| 2002/0148106 A1* | 10/2002 | Tsukada et al. ............. 29/610.1 |
| 2002/0175667 A1* | 11/2002 | Huard ........................ 324/72.5 |
| 2003/0160625 A1 | 8/2003 | Kaufman et al. |
| 2003/0210100 A1* | 11/2003 | Matsuo et al. ................ 331/101 |
| 2004/0032268 A1* | 2/2004 | Schulte ........................ 324/658 |
| 2004/0155644 A1* | 8/2004 | Stauth et al. .............. 324/117 R |
| 2006/0269186 A1* | 11/2006 | Frame et al. .................... 385/12 |

FOREIGN PATENT DOCUMENTS

| | | |
|---|---|---|
| GB | 2 264 788 | 9/1993 |

* cited by examiner

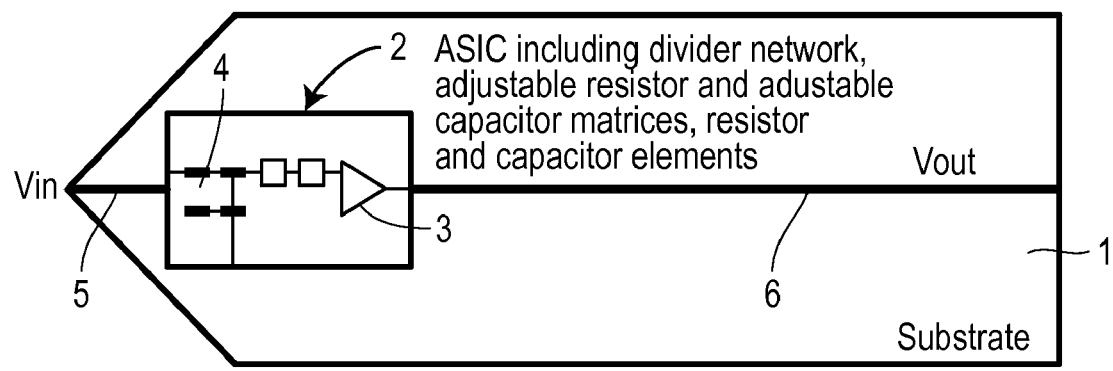

OSCILLOSCOPE PROBE

BACKGROUND OF THE INVENTION

1. Field of the Invention

The invention relates to an oscilloscope probe comprising a transistor amplifier on a semiconductor substrate using integrated-circuit technology with an input-voltage divider.

2. Related Technology

Active probes for earthed or differential oscilloscopes contain an amplifier acting as an impedance converter, which taps the signal to be measured in a high-ohmic manner via the probe tip and, at the output, supplies the signal via a corresponding high-frequency cable to the input of the oscilloscope with a characteristic impedance generally of 50 ohms. An input-voltage divider, which is constructed from resistors and capacitors and is used to increase the linear range of the amplifier and to compensate its input capacity, is generally connected upstream of this amplifier. This input divider represents the limiting factor for the further miniaturization of this type of active probe. Moreover, it generates parasitic effects, which limit the bandwidth of active probes of this kind. Finally, an amplifier of this type can cause oscillations, if it is not matched at the input in a low-ohmic manner. This occurs, if the amplifier input is connected to the input divider via a bonding wire, which provides a high impedance for high-frequencies.

All of the known active probes for oscilloscopes use voltage dividers, which are constructed either of discrete components or realized using thick-layer or thin-layer technology (for example, according to U.S. patent specifications U.S. Pat. No. 5,172,051, U.S. Pat. No. 6,483,284, U.S. Pat. No. 6,949,919, U.S. Pat. No. 6,982,550, U.S. Pat. No. 5,061,892, U.S. Pat. No. 5,796,308, U.S. Pat. No. 6,720,828, U.S. Pat. No. 6,967,473 or U.S. Pat. No. 6,828,769). The elements of the voltage divider in this context are disposed on a ceramic or printed-circuit-board substrate together with the amplifier chip, which is provided as an integral component. The adjustment of the voltage divider is implemented via potentiometers, varactor diodes or by laser adjustment of resistor or capacitor surfaces on the substrate. With all of these known arrangements, a large part of the substrate surface is occupied by the adjustable voltage divider. Furthermore, parasitic elements of the voltage divider generate undesirable frequency responses, which reduce the bandwidth to a few GHz. Such parasitic elements are primarily inductances and capacitances of the relatively-large, thick-layer elements in the millimeter range and the inductance of the bonding wires between the elements. In the case of a structure built up from discrete components, the influence of parasitic elements is usually even more dominant.

SUMMARY OF THE INVENTION

The invention is therefore provides an oscilloscope probe with an input-voltage divider and amplifier, which avoids these disadvantages.

The invention provides an oscilloscope probe comprising a transistor amplifier constructed on a semiconductor substrate using integrated-circuit technology and with an input-voltage divider series connected to the latter, characterized in that at least one part of the input-voltage divider is also constructed together with the amplifier using integrated circuit technology on the semiconductor substrate.

According to the invention, at least one part, preferably the entire voltage divider is constructed together with the amplifier on the semiconductor substrate using integrated circuit technology. With modern semiconductor technology, additional trimming points, by means of which the probe of the voltage divider can be adjusted even after assembly, can readily be provided on the semiconductor substrate. This can be implemented, for example, using additional matrices of parallel and/or serial connected resistors or capacitors, of which the supply lines are cut selectively, for example, using laser technology. The components integrated on the semiconductor chip are substantially smaller than those used in thick-layer technology or as single components; they fall within the range around 10 µm. Accordingly, a voltage divider of this kind can be constructed to be almost free from disturbing parasitic elements in the frequency range up to, for example, 10 GHz. Furthermore, the semiconductor chip can be placed directly on the substrate edge of the probe, which considerably reduces the dimensions of the signal path of the probe and allows further miniaturization of the probes. The direct integration of the input divider and amplifier avoids a previously-conventional connecting wire and the resulting, formerly-disturbing high impedance at high frequencies. The dimensions of the amplifier chip are hardly increased, if at all, by the integration of this divider, because the chip surface is generally limited by the size of the contact surfaces.

If possible, the entire input-voltage divider should be integrated on the amplifier chip; as an alternative, however, it is possible to integrate only one part of this voltage divider on the semiconductor chip, while the smallest possible part is designed using conventional technology. For example, the capacitors and low-ohmic resistors can be integrated on the semiconductor chip, while the high-ohmic resistors (up to 2 MOhms) continue to be realized using thick-layer technology or as hybrid components on the substrate. The invention can be used with earthed and also with differential probes.

BRIEF DESCRIPTION OF THE DRAWING

The invention is described in greater detail below on the basis of an exemplary embodiment with reference to a schematic drawing. The drawing is as follows:

DETAILED DESCRIPTION

The drawing of the invention shows a substrate 1 made of ceramic or in the form of a printed-circuit board built into a probe for an oscilloscope, on which a semiconductor chip is positioned, in which an amplifier 3 is integrated together with an input-voltage divider 4, for example, in the form of an ASIC on a corresponding semiconductor substrate 2. The input of the voltage divider 4 is connected to a printed conductor 5, which leads to the tip of the probe. The output of the amplifier 3 is connected to the printed conductor 6, which forms the output of the probe, which is connected via a cable to the actual oscilloscope, which is not illustrated.

Additional matrices of parallel-connected and/or serial-connected resistors and/or capacitors, of which the supply lines can be cut selectively using laser technology, so that the input voltage divider can also be trimmed even after the assembly of the probe, are preferably provided within the region of the voltage divider 4 consisting of resistors and capacitors. These matrices are also preferably formed on the semiconductor substrate using semiconductor technology. The resistor and capacitor elements constructed using semiconductor technology can also be adjusted by cutting their surfaces in a selective manner.

The invention is not restricted to the exemplary embodiment presented. All of the features described and/or illustrated can be combined with one another as required.

The invention claimed is:

1. Oscilloscope probe comprising:
   a transistor amplifier on a semiconductor substrate and integrated with an input-voltage divider connected in series and upstream to the transistor amplifier,
   wherein at least one part of the input-voltage divider is also integrated together with the amplifier on the semiconductor substrate,
   wherein adjustable resistor and adjustable capacitor matrices adapted to trim the input voltage divider are integrated on the semiconductor substrate and are allocated to resistor and capacitor elements of the input-voltage divider also integrated on the semiconductor substrate,
   wherein the resistor and capacitor elements are adjustable by cutting their surfaces in a selective manner, and
   wherein the adjustable resistor and capacitor matrices and/or the resistor and capacitor elements are disposed on the semiconductor substrate in such a manner that they can still be adjusted even after the assembly of the probe.

2. Oscilloscope probe according to claim 1, wherein only the capacitors and low-ohmic resistors of the input-voltage divider are integrated on the semiconductor substrate.

* * * * *